(12) United States Patent
Choi et al.

(10) Patent No.: US 7,790,601 B1
(45) Date of Patent: Sep. 7, 2010

(54) FORMING INTERCONNECTS WITH AIR GAPS

(75) Inventors: Samuel S. S. Choi, Hopewell Juction, NY (US); Lawrence A. Clevenger, Hopewell Junction, NY (US); Maxime Darnon, Yorktown Heights, NY (US); Daniel C. Edelstein, Yorktown Heights, NY (US); Satyanarayana Venkata Nitta, Yorktown Heights, NY (US); Shom Ponoth, Albany, NY (US); Pak Leung, Cedar Park, TX (US)

(73) Assignees: International Business Machines Corporation, Armonk, NY (US); Freescale Semiconductor Inc., Austin, TX (US)

( * ) Notice: Subject to any disclaimer, the term of this patent is extended or adjusted under 35 U.S.C. 154(b) by 0 days.

(21) Appl. No.: 12/561,651

(22) Filed: Sep. 17, 2009

(51) Int. Cl.
  *H01L 21/4763* (2006.01)
(52) U.S. Cl. ............... 438/619; 438/783; 257/E21.587
(58) Field of Classification Search ................. 438/619, 438/783
  See application file for complete search history.

(56) References Cited

U.S. PATENT DOCUMENTS

| 7,309,649 | B2 | 12/2007 | Colbum et al. |
| 7,531,444 | B2 | 5/2009 | Dimitrakopoulos et al. |
| 2001/0005625 | A1* | 6/2001 | Sun .............................. 438/634 |
| 2005/0179135 | A1* | 8/2005 | Kumar ......................... 257/758 |
| 2006/0202302 | A1* | 9/2006 | Geffken et al. .............. 257/522 |
| 2008/0073748 | A1* | 3/2008 | Bielefeld et al. ............. 257/522 |
| 2009/0130863 | A1* | 5/2009 | Toma et al. .................. 438/795 |

\* cited by examiner

*Primary Examiner*—Alexander G Ghyka
(74) *Attorney, Agent, or Firm*—Yuanmin Cai; Ira Blecker

(57) ABSTRACT

Disclosed is a process of an integration method to form an air gap in an interconnect. On top of a metal wiring layer on a semiconductor substrate is deposited a dielectric cap layer followed by a sacrificial dielectric layer and pattern transfer layers. A pattern is transferred through the pattern transfer layers, sacrificial dielectric layer, dielectric cap layer and into the metal wiring layer. The presence of the sacrificial dielectric layer aids in controlling the thickness and profile of the dielectric cap layer which in turn affects reliability of the interconnect.

18 Claims, 3 Drawing Sheets ns in modern day semiconductor chips typically have multilevel structures containing patterns of metal wiring layers that are encapsulated in an insulator. The insulator material is called the interlevel dielectric. Conductive vias are formed in the interlevel dielectric to provide interlevel contacts between the metal wiring.

FORMING INTERCONNECTS WITH AIR GAPS

BACKGROUND OF THE INVENTION

The present invention is directed to a method of forming interconnects with air gaps and, more particularly, to a method wherein a sacrificial dielectric layer is deposited to control the depth and profile of the air gap.

Device interconnections in modern day semiconductor chips typically have multilevel structures containing patterns of metal wiring layers that are encapsulated in an insulator. The insulator material is called the interlevel dielectric. Conductive vias are formed in the interlevel dielectric to provide interlevel contacts between the metal wiring.

Through their effects on signal propagation delays, the materials and layout of these interconnect structures can substantially impact chip speed and thereby chip performance. Signal-propagation delays are due to RC time constants wherein "R" is the resistance of the on-chip wiring, and "C" is the effective capacitance between the signal lines and the surrounding conductors in the multilevel interconnection stack. RC time constants are reduced by lowering the specific resistance of the wiring material and by using interlevel dielectrics (ILDs) with lower dielectric constants, k.

A preferred metal/dielectric combination for low RC interconnect structures is copper metal with a dielectric such as $SiO_2$ (k~4.0). Due to difficulties in subtractively patterning copper, copper-containing interconnect structures are typically fabricated by a damascene process. In a typical damascene process, metal patterns that are inset in a layer of dielectric are formed by the steps of: (i) etching holes (for vias) or trenches (for wiring) into the interlevel dielectric; (ii) optionally, lining the holes or trenches with one or more adhesion or diffusion barrier layers; (iii) overfilling the holes or trenches with a metal wiring material; and (iv) removing the metal overfill by a planarizing process such as chemical-mechanical polishing (CMP), leaving the metal even with the upper surface of the dielectric.

The above-mentioned processing steps can be repeated until the desired number of wiring and via levels have been fabricated.

Replacing the silicon dioxide with a low κ dielectric of the same thickness reduces parasitic capacitance, enabling faster switching speeds and lower heat dissipation. One such example of a low k material is a silicon, carbon, oxygen and hydrogen compound known as SiCOH.

BRIEF SUMMARY OF THE INVENTION

The ultimate low k dielectric material is air and there has been interest in replacing a portion of the low k dielectric material with air. The present invention pertains to a methodology for incorporating air gaps in low k dielectric material.

The various advantages and purposes of the present invention as described above and hereafter are achieved by providing, according to a first aspect of the invention, a method of forming interconnects with an air gap which includes the steps of obtaining a semiconductor substrate having at least one metal wiring layer comprising wiring features embedded in an interlevel dielectric material; depositing a dielectric cap layer over the at least one metal wiring layer; depositing a sacrificial dielectric layer over the dielectric cap layer; depositing and patterning a photoresist layer to form an opening aligned over an area between two wiring features; etching the sacrificial dielectric layer and dielectric cap layer to form an opening in the sacrificial dielectric layer and dielectric cap layer aligned over the area; etching the interlevel dielectric between the two wiring features to form an air gap; and depositing an interlevel dielectric to pinch off and seal the air gap.

According to a second aspect of the invention, there is provided a method of forming interconnects with an air gap which includes the steps of obtaining a semiconductor substrate having at least one metal wiring layer comprising an interlevel dielectric material; depositing a dielectric cap layer over the at least one metal wiring layer; depositing a sacrificial dielectric layer over the dielectric cap layer; depositing and patterning a photoresist layer to form an opening; etching the sacrificial dielectric layer and dielectric cap layer to form an opening in the sacrificial dielectric layer and dielectric cap layer; etching the interlevel dielectric through the opening in the sacrificial dielectric layer and the dielectric cap layer to form an air gap; and depositing an interlevel dielectric to pinch off and seal the air gap.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Control of the top trench profile control is critical for air gap integration technology. The present invention pertains to the introduction of a sacrificial dielectric layer in a dual damascene like copper integration process to control trench depth and profile. Traditional immersion lithography combined with a highly polymerizing reactive ion etching (RIE) process results in side effects such as tapered trench profile and polymer byproduct. To control an air gap volume for small features in the 45/32 nm nodes and beyond, low pressure plasma condition is used. However, this condition promotes faceting from highly anisotropic ion bombardment.

Figure 1:
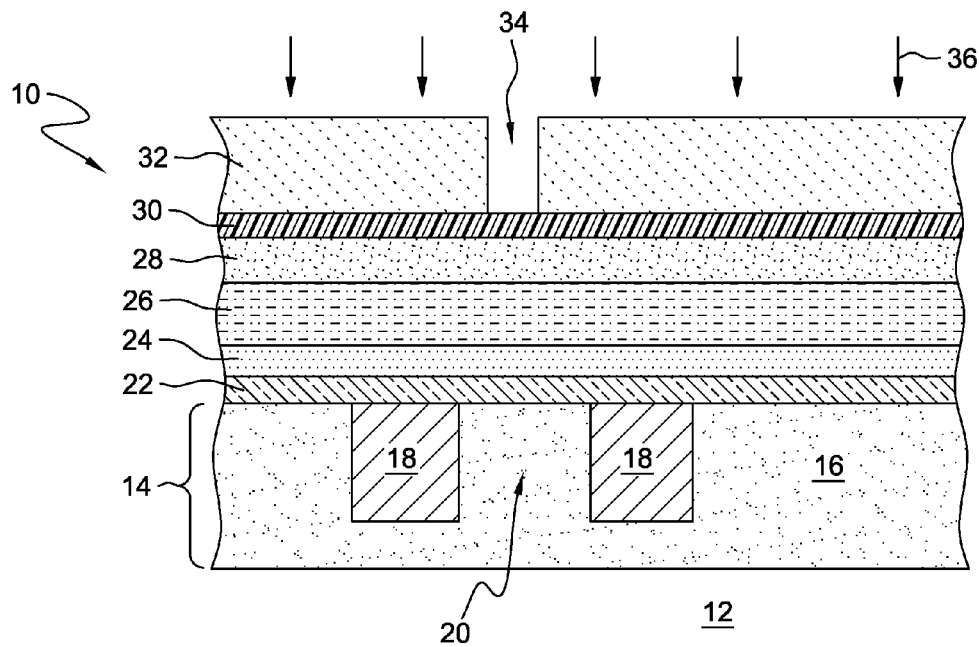
FIG. 1 illustrates the integration of the inventive layer of the present invention in a trilayer structure.
Figure 2:
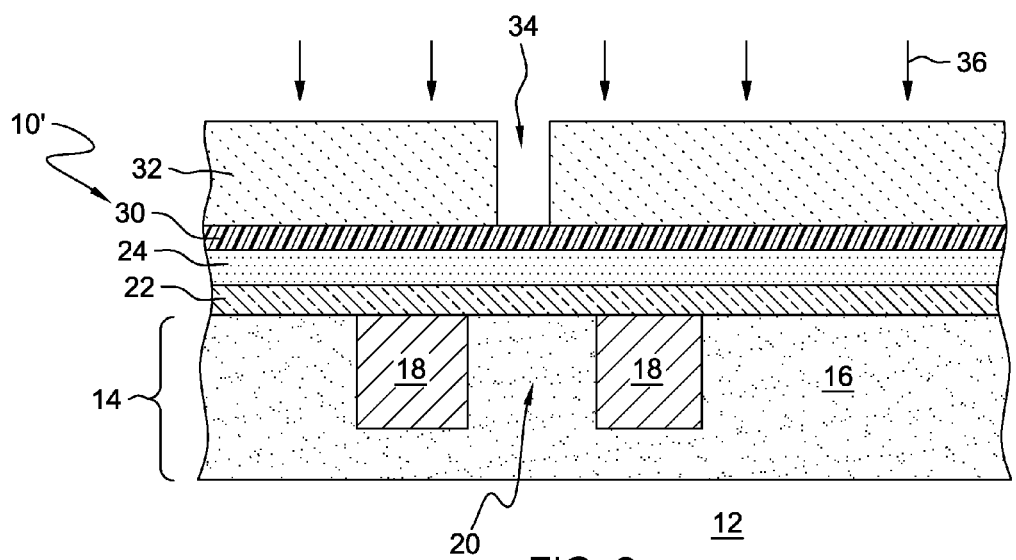
FIG. 2 illustrates the integration of the inventive layer of the present invention in a single layer structure.

Referring to the Figures in more detail, and particularly referring to FIGS. 1 and 2, illustrated are two starting structures incorporating the inventive layer of the present invention. Shown in FIG. 1 is a trilayer integration structure 10 which illustrates an example of dual damascene integration in which via first and trench second formation is used while FIG. 2 is a single layer integration structure 10' which illustrates an example of a trench first and via second formation or for single damascene integration.

Referring first to FIG. 1, there is shown a semiconductor substrate 12 which can be a bulk silicon or silicon on insulator structure. All of the front end of the line processing occurs with respect to semiconductor substrate 12 wherein all of the semiconductor devices are formed. Details of semiconductor substrate 12 are not shown as they are not relevant to the present invention. On top of semiconductor substrate is formed a metal wiring layer including interlevel dielectric material 16 and metal wiring features 18. There usually will be several such metal wiring layers 14 but only one is shown in FIG. 1 for clarity. Metal wiring layer 14 is formed in a part of the semiconductor processing line called back end of the line (BEOL). Interlevel dielectric material 16 can be any conventional dielectric material such as silicon dioxide ($SiO_2$) but for purposes of the present invention, interlevel dielectric material 16 is preferably a low k dielectric material. Some examples of low k dielectric materials are silicon-carbon-oxygen-hydrogen (Si—C—O—H), porous SiCOH, and polyarylene (SiLK, available from Dow Chemical Company). Metal wiring for metal wiring features 18 can be any metal that is conventionally used in semiconductors but is most preferably copper. As shown in FIG. 1, the metal wiring layer 14 is formed and ready for receiving an air gap between metal wiring features 18 in the area indicated by arrow 20. The metal wiring features 18 can be wiring lines, vias or both types of wiring features.

Still referring to FIG. 1, deposited on top of metal wiring layer 14 is a capping layer 22, typically a silicon nitride material. Bilayer cap films with low and high dielectric constant can also be used. The silicon nitride layer may have a thickness of 10 to 50 nm. Thereafter, a sacrificial dielectric layer 24 is deposited having a thickness of 10 to 100 nm followed by an optical planarizing layer (OPL) 26, oxide layer 28 and conventional antireflection (ARC) layer 30. The optical planarizing layer may be 100 to 400 nm thick and comprise a non photo-reactive organic film like resist. Some particular examples of OPLs are ODL (available from Shinetsu) and NFC (available from Japan Synthetic Rubber). The oxide layer 28 may be 10 to 100 nm thick. Lastly, a conventional photoresist layer 32 is exposed and developed to form a photoresist mask having an opening 34. The photoresist mask will be used to transfer the opening 34 into the underlying layers 22-30, and wiring layer 14.

Referring now to FIG. 2, there is shown a second starting structure 10 which has a semiconductor substrate 12 which can be a bulk silicon or silicon on insulator structure. Again, details of semiconductor substrate 12 are not shown as they are not relevant to the present invention. On top of semiconductor substrate is formed a metal wiring layer including interlevel dielectric material 16 and metal wiring features 18. There usually will be several such metal wiring layers 14 but only one is shown in FIG. 2 for clarity. Interlevel dielectric material 16 can be any conventional dielectric material such as silicon dioxide ($SiO_2$) but for purposes of the present invention, interlevel dielectric material 16 is preferably a low k dielectric material. Metal wiring for metal wiring features 18 can be any metal that is conventionally used in semiconductors but is most preferably copper. As shown in FIG. 2, the metal wiring layer 14 is formed and ready for receiving an air gap between metal wiring features 18 in the area indicated by arrow 20. The metal wiring features 18 can be wiring lines, vias or both types of wiring features.

Still referring to FIG. 2, deposited on top of metal wiring layer 14 is a capping layer 22, typically a silicon nitride material. The silicon nitride layer may have a thickness of about 10 to 50 nm. Thereafter, a sacrificial dielectric layer 24 is deposited to a thickness of about 10-100 nm followed by a conventional antireflection (ARC) layer 30. It is to be noted that when an OPL is not used, the oxide layer 28 shown in FIG. 1 will not be necessary. Lastly, a conventional photoresist layer 32 is exposed and developed to form a photoresist mask having an opening 34. The photoresist mask will be used to transfer the opening 34 into the underlying layers 22, 24, 30, and wiring layer 14.

In the embodiments of the present invention, an additional sacrificial oxide-like dielectric film 24 is deposited between the dielectric cap layer 22 and pattern transfer films, such as OPL 26, oxide layer 28, antireflection layer 30 and photoresist 32 in FIG. 1 or antireflection layer 30 and photoresist 32 in FIG. 2. The sacrificial dielectric layer 24 protects the dielectric cap layer 22 from ion bombardment in the subsequent trench formation etch and in the in-situ ash steps. The control of the dielectric cap layer 22 thickness and profile is critical for air gap technology since the critical dimension defines the pinch off height (discussed hereafter in FIG. 5) and thickness affects reliability. Moreover, the sacrificial dielectric layer 24 provides the ability to use an aggressive plasma ash to remove residual reactive ion etch polymer which is critical for yield and reliability. And other post ash conditions such as deflourination can be done without compromising the dielectric cap layer 22.

The sacrificial dielectric layer 24 thickness is optimized for the level of application, thinwire versus fatwire. To form high aspect ratio air gaps, geometry dimensions of $200 \times 600$ $nm^2$ are used. To etch a trench depth of more than 1 um, a 1.5 um resist mask may be used. However, this resist mask may be too thick to resolve a geometry of $200 \times 600$ $nm^2$. For the 1.0 um etch depth application with an open area of $200 \times 600$ $nm^2$, a thinner resist mask is required to print this area but there is not enough resist budget to etch to 1.0 um depth without some undesirable etching of the dielectric cap layer 22. But with the deposition of a sacrificial dielectric layer 24, the dielectric cap layer 22 profile/thickness is maintained during the long plasma process in which the resist pulls laterally exposing the sacrificial dielectric layer 24. Hence the plasma bombards the sacrificial dielectric layer 24 and not the dielectric cap layer 22. The air gaps may be formed with a slow plasma etching process having a plasma chemistry of CF4:CO 20 sccm/200 sccm at 80-150 mT which is a selective etch in which the sacrificial dielectric layer 24 is etched and stops on the dielectric cap layer 22.

The embodiments of the present invention work with minor modification to the current interconnect integration. The composition of the sacrificial dielectric layer 24 is chosen so that it does not damage the dielectric cap layer 22 and can be selectively removed. The sacrificial dielectric layer 24 is removed in a wet chemistry of hydrofluoric acid. Examples of materials suitable for the sacrificial dielectric layer 24 include, but are not limited to, CVD/PECVD silicon oxide, spin on silicon oxide, PECVD SiHxNy (hydrogen incorporated into SiN), SiCOH, and germanium oxide. In general, the sacrificial dielectric layer 24 may be any material that can be removed in a wet chemistry of hydrofluoric acid.

Both of the semiconductor structures 10, 10' are processed similarly hereafter. A reactive ion etch (RIE) process 36 is utilized to transfer the opening 34 in photoresist 32 through the pattern transfer films, such as OPL 26, oxide layer 28, antireflection layer 30 to sacrificial dielectric layer 24 in FIG. 1, or through antireflection layer 30 to sacrificial dielectric layer 24 in FIG. 2. Standard plasma chemistries consisting of fluorocarbon, oxygen, and argon gases are used to transfer patterns into a dielectric film.

The next step is in-situ ash to remove the organic mask layer. In this step, a low bias and pressure plasma chemistry is used to control the low-k ILD damage for airgap formation. The ash chemistry consists of carbon dioxide gas flow of 500-1500 sccm, RF plasma source of 13.56 MHz, power of 200-1000 W, and a pressure range of 40-200 mT. However, the low bias plasma condition is not an effective condition to remove the residual RIE polymer.

Figure 3:
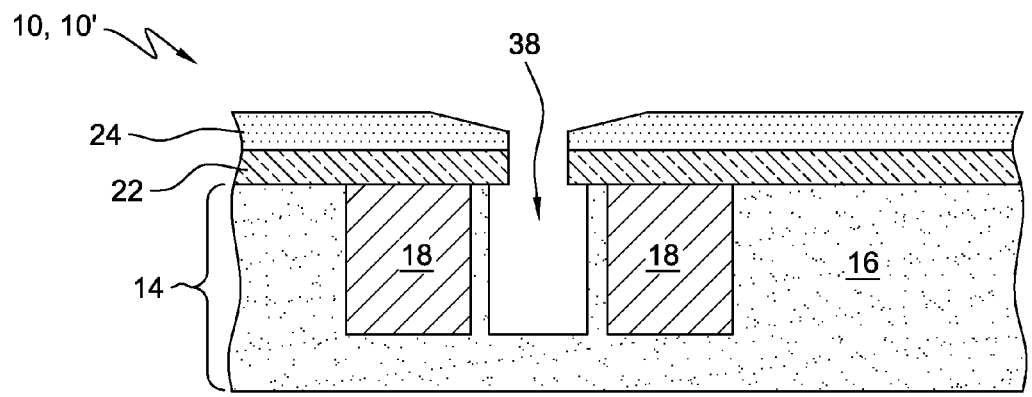
FIG. 3 illustrates the structure after etching a trench between metal wiring to form an air gap.

The resulting semiconductor structure 10, 10' is shown in FIG. 3 having a trench 38 formed between metal wiring features 18. Trench 38 will be the air gap in the finished structure.

Figure 4:
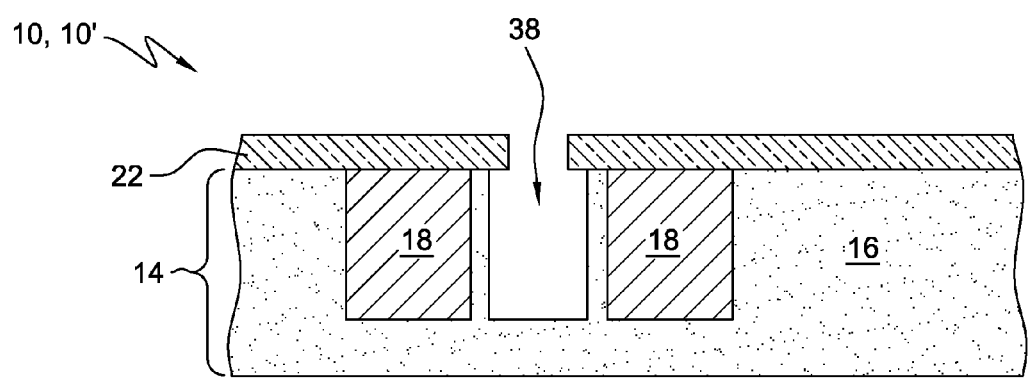
FIG. 4 illustrates the structure after removal of the inventive layer of the present invention.

The next step after RIE is a wet chemical HF etch to remove residual RIE polymer and any damaged low-k dielectric. In this step, the sac-oxide layer is also removed as shown in FIG. 4. The dielectric sacrificial layer 24 thickness and wet chemistry times may be optimized to ensure complete removal of the dielectric sacrificial layer 24. To remove 40 nm of the sacrificial dielectric layer 24, a 300:1 DHF (dilute hydrofluoric acid) solution is used for 200-400 sec to ensure complete removal with overetch time. Excessive over etch times can result in deleterious wafer effects such as delamination of dielectric and copper materials. Without the dielectric sacrificial layer 24, erosion of the dielectric cap layer 22 can occur and to minimize this erosion, a RIE process is designed to be less aggressive in ion bombardment which in turn results in less effective ash process.

Figure 5:
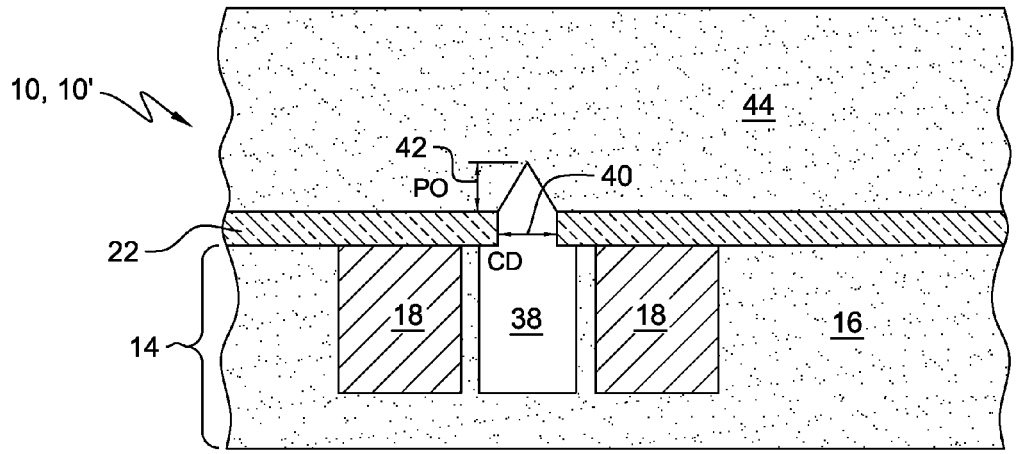
FIG. 5 illustrates the structure after the next layer of interlevel dielectric has been deposited.

Referring now to FIG. 5, another layer of ILD 44 has been deposited for the next layer of metal wiring. It can be seen that the critical dimension (CD) 40 of the air gap 38 is chosen so that the pinch off (PO) height 42 of the ILD meets design specifications. The presence of the sacrificial dielectric layer 24 aids in the controlling of the thickness and profile of the dielectric cap layer 22 which in turn controls the PO height 42. The PO height 42 needs to be controlled to ensure that the next level metal wiring level does not intersect this gap. If the PO height 42 is breached at the next metal wiring level, then electrical failure occurs.

Figure 6:
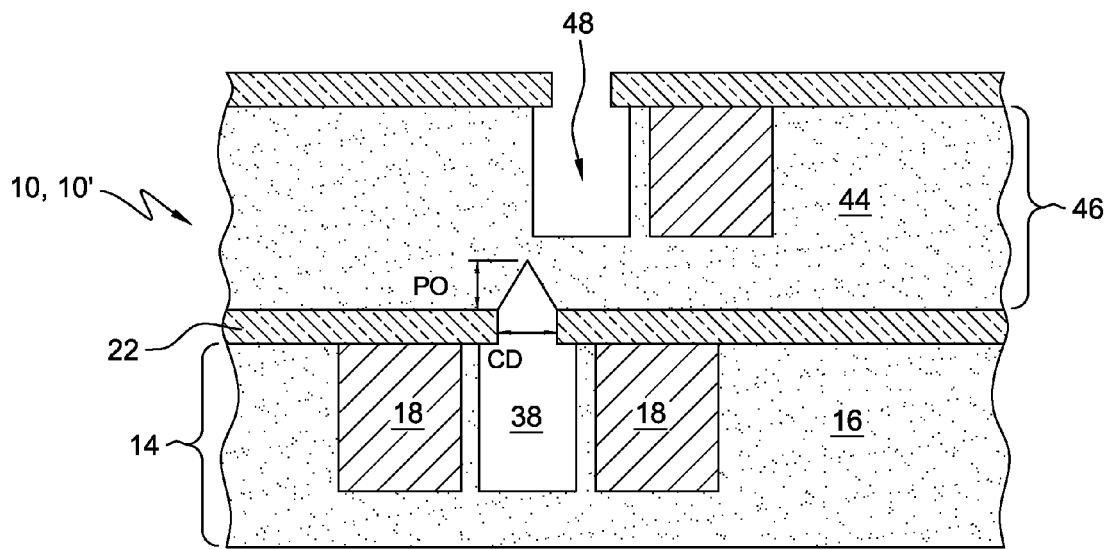
FIG. 6 illustrates the structure after an air gap has been formed in the next layer of interlevel dielectric.

Referring now to FIG. 6, the ILD 44 is patterned in a similar way to ILD 16 to form another wiring layer 46 having an air gap 48. While air gap 48 is adjacent to only one wiring line in wiring layer 46, there may be more than one wiring line adjacent to air gap 48, for example as shown in wiring layer 14.

The process would continue to repeat until the desired number of wiring layers are formed. Some or all of the remaining number of wiring layers may have air gaps fabricated according to the process described above.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

We claim:

1. A method of forming interconnects with an air gap comprising the steps of:
    obtaining a semiconductor substrate having at least one metal wiring layer comprising wiring features embedded in an interlevel dielectric material;
    depositing a dielectric cap layer over the at least one metal wiring layer;
    depositing a sacrificial dielectric layer over the dielectric cap layer;
    depositing and patterning a photoresist layer to form an opening aligned over an area between two wiring features;
    etching the sacrificial dielectric layer and dielectric cap layer to form an opening in the sacrificial dielectric layer and the dielectric cap layer aligned over the area;
    etching the interlevel dielectric between the two wiring features to form an air gap; and
    depositing another interlevel dielectric to pinch off and seal the air gap wherein the sacrificial dielectric layer is removed prior to the step of depositing the interlevel dielectric to pinch off and seal the air gap.

2. The method of claim 1 wherein during the step of etching the interlevel dielectric, the sacrificial dielectric layer is removed.

3. The method of claim 1 wherein the dielectric cap layer comprises silicon nitride.

4. The method of claim 1 wherein the interlevel dielectric is a low dielectric constant dielectric material.

5. The method of claim 1 wherein the sacrificial dielectric layer comprises a material selected from a group consisting of silicon oxide, $SiH_xN_y$, SiCOH and germanium oxide.

6. The method of claim 1 further comprising depositing an antireflective layer between the sacrificial dielectric layer and the photoresist layer.

7. The method of claim 1 further comprising depositing an optical planarizing layer on the sacrificial dielectric layer followed by depositing an oxide layer and an antireflective layer prior to depositing the photoresist layer.

8. The method of claim 1 wherein between the steps of etching the interlevel dielectric and depositing another interlevel dielectric further comprising the step of removing the sacrificial dielectric layer.

9. The method of claim 8 wherein the step of removing is by a wet chemistry process using dilute hydrofluoric acid.

10. A method of forming interconnects with an air gap comprising the steps of:
    obtaining a semiconductor substrate having at least one metal wiring layer comprising an interlevel dielectric material;
    depositing a dielectric cap layer over the at least one metal wiring layer;
    depositing a sacrificial dielectric layer over the dielectric cap layer;
    depositing and patterning a photoresist layer to form an opening;
    etching the sacrificial dielectric layer and dielectric cap layer to form an opening in the sacrificial dielectric layer and the dielectric cap layer;
    etching the interlevel dielectric through the opening in the sacrificial dielectric layer and the dielectric cap layer to form an air gap; and
    depositing another interlevel dielectric to pinch off and seal the air gap wherein the sacrificial dielectric layer is removed prior to the step of depositing the interlevel dielectric to pinch off and seal the air gap.

11. The method of claim 10 wherein during the step of etching the interlevel dielectric, the sacrificial dielectric layer is removed.

12. The method of claim 10 wherein the dielectric cap layer comprises silicon nitride.

13. The method of claim 10 wherein the interlevel dielectric is a low dielectric constant dielectric material.

14. The method of claim 10 wherein the sacrificial dielectric layer comprises a material selected from the group consisting of silicon oxide, $SiH_xN_y$, SiCOH and germanium oxide.

15. The method of claim 10 further comprising depositing an antireflective layer between the sacrificial dielectric layer and the photoresist layer.

16. The method of claim 10 further comprising depositing an optical planarizing layer on the sacrificial dielectric layer followed by depositing an oxide layer and an antireflective layer prior to depositing the photoresist layer.

17. The method of claim 10 wherein between the steps of etching the interlevel dielectric and depositing another interlevel dielectric further comprising the step of removing the sacrificial dielectric layer.

18. The method of claim 17 wherein the step of removing is by a wet chemistry process using dilute hydrofluoric acid.

* * * * *